(12) United States Patent
Bhatnagar et al.

(10) Patent No.: US 9,481,608 B2
(45) Date of Patent: Nov. 1, 2016

(54) SURFACE ANNEALING OF COMPONENTS FOR SUBSTRATE PROCESSING CHAMBERS

(71) Applicant: Applied Materials, Inc., Santa Clara, CA (US)

(72) Inventors: Ashish Bhatnagar, Fremont, CA (US); Laxman Murugesh, San Ramon, CA (US); Padma Gopalakrishnan, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 553 days.

(21) Appl. No.: 14/088,216

(22) Filed: Nov. 22, 2013

(65) Prior Publication Data

US 2014/0167327 A1 Jun. 19, 2014

Related U.S. Application Data

(62) Division of application No. 11/181,041, filed on Jul. 13, 2005, now Pat. No. 8,617,672.

(51) Int. Cl.
| | |
|---|---|
| *C04B 41/00* | (2006.01) |
| *B23K 26/00* | (2014.01) |
| *H01L 21/67* | (2006.01) |
| *H01L 21/683* | (2006.01) |
| *C03B 25/02* | (2006.01) |

(52) U.S. Cl.
CPC ....... *C04B 41/0036* (2013.01); *B23K 26/0066* (2013.01); *C03B 25/02* (2013.01); *H01L 21/67115* (2013.01); *H01L 21/6831* (2013.01); *Y10T 428/131* (2015.01)

(58) Field of Classification Search
None
See application file for complete search history.

(56) References Cited

U.S. PATENT DOCUMENTS

| | | | |
|---|---|---|---|
| 2,705,500 | A | 4/1955 | Deer |
| 3,117,883 | A | 1/1964 | Pierett |
| 3,457,151 | A | 7/1969 | Kortejarvi |
| 3,482,082 | A | 12/1969 | Israeli |
| 3,522,083 | A | 7/1970 | Woolman |
| 3,565,771 | A | 2/1971 | Gulla |
| 3,679,460 | A | 7/1972 | Reid |
| 3,843,472 | A | 10/1974 | Toussaint et al. |
| 3,848,104 | A | 11/1974 | Locke |
| 4,358,659 | A | 11/1982 | Spohnheimer |

(Continued)

FOREIGN PATENT DOCUMENTS

| | | |
|---|---|---|
| DE | 19719133 | 11/1998 |
| EP | 0239349 | 9/1987 |

(Continued)

OTHER PUBLICATIONS

Nakasuji, et al., "Low Voltage and High Speed Operating Electrostatic Wafer Chuck," J. Vac. Sci. Technol. A, 10(6):3573-3578 (Nov./Dec. 1992).

(Continued)

*Primary Examiner* — Benjamin Schiffman
(74) *Attorney, Agent, or Firm* — Ashok K. Janah; Janah & Associates, P.C.

(57) ABSTRACT

A method of fabricating a processing chamber component comprises forming a processing chamber component having a structural body with surface regions having microcracks, and directing a laser beam onto the microcracks of the surface regions of the structural body for a sufficient time to heal and close off the microcracks by themselves.

20 Claims, 5 Drawing Sheets

(56) References Cited

U.S. PATENT DOCUMENTS

| | | |
|---|---|---|
| RE31,198 E | 4/1983 | Binns |
| 4,412,133 A | 10/1983 | Eckes et al. |
| 4,419,201 A | 12/1983 | Levinstein et al. |
| 4,430,360 A | 2/1984 | Bill et al. |
| 4,480,284 A | 10/1984 | Tojo et al. |
| 4,491,496 A | 1/1985 | Laporte et al. |
| 4,606,802 A | 8/1986 | Kobayashi et al. |
| 4,643,950 A | 2/1987 | Ogura et al. |
| 4,645,218 A | 2/1987 | Ooshio et al. |
| 4,665,463 A | 5/1987 | Ward et al. |
| 4,673,554 A | 6/1987 | Niwa et al. |
| 4,713,119 A | 12/1987 | Earhart et al. |
| 4,717,462 A | 1/1988 | Homma et al. |
| 4,732,792 A | 3/1988 | Fujiyama |
| 4,756,322 A | 7/1988 | Lami |
| 4,814,575 A | 3/1989 | Petitbon |
| 4,832,781 A | 5/1989 | Mears |
| 4,872,250 A | 10/1989 | De Marco |
| 4,913,784 A | 4/1990 | Bogenschutz et al. |
| 4,959,105 A | 9/1990 | Neidiffer et al. |
| 4,995,958 A | 2/1991 | Anderson et al. |
| 4,996,859 A | 3/1991 | Rose et al. |
| 5,009,966 A | 4/1991 | Garg et al. |
| 5,032,469 A | 7/1991 | Merz et al. |
| 5,035,787 A | 7/1991 | Parker et al. |
| 5,055,964 A | 10/1991 | Logan et al. |
| 5,064,511 A | 11/1991 | Gobbetti et al. |
| 5,104,501 A | 4/1992 | Okabayashi |
| 5,104,834 A | 4/1992 | Watanabe et al. |
| 5,117,121 A | 5/1992 | Watanabe et al. |
| 5,151,845 A | 9/1992 | Watanabe et al. |
| 5,164,016 A | 11/1992 | Henriet et al. |
| 5,166,856 A | 11/1992 | Liporace et al. |
| 5,180,322 A | 1/1993 | Yamamoto et al. |
| 5,180,563 A | 1/1993 | Lai et al. |
| 5,191,506 A | 3/1993 | Logan et al. |
| 5,202,008 A | 4/1993 | Talieh |
| 5,215,624 A | 6/1993 | Dastolfo et al. |
| 5,215,639 A | 6/1993 | Boys |
| 5,242,706 A | 9/1993 | Cotell et al. |
| 5,248,386 A | 9/1993 | Dastolfo et al. |
| 5,258,047 A | 11/1993 | Tokisue et al. |
| 5,270,266 A | 12/1993 | Hirano et al. |
| 5,275,683 A | 1/1994 | Arami et al. |
| 5,280,156 A | 1/1994 | Niori et al. |
| 5,292,554 A | 3/1994 | Sinha et al. |
| 5,304,248 A | 4/1994 | Cheng et al. |
| 5,314,597 A | 5/1994 | Harra |
| 5,315,473 A | 5/1994 | Collins et al. |
| 5,324,053 A | 6/1994 | Kubota et al. |
| 5,325,261 A | 6/1994 | Horwitz |
| 5,338,367 A | 8/1994 | Henriet et al. |
| 5,350,479 A | 9/1994 | Collins et al. |
| 5,356,723 A | 10/1994 | Kimoto et al. |
| 5,366,585 A | 11/1994 | Robertson et al. |
| 5,382,469 A | 1/1995 | Kubota et al. |
| 5,391,275 A | 2/1995 | Mintz |
| 5,401,319 A | 3/1995 | Banholzer et al. |
| 5,407,551 A | 4/1995 | Sieck et al. |
| 5,409,590 A | 4/1995 | Hurwitt et al. |
| 5,427,825 A | 6/1995 | Murnick |
| 5,429,711 A | 7/1995 | Watanabe et al. |
| 5,433,835 A | 7/1995 | Demaray et al. |
| 5,458,759 A | 10/1995 | Hosokawa et al. |
| 5,460,694 A | 10/1995 | Schapira et al. |
| 5,463,526 A | 10/1995 | Mundt |
| 5,474,649 A | 12/1995 | Kava et al. |
| 5,487,822 A | 1/1996 | Demaray et al. |
| 5,490,913 A | 2/1996 | Schertler et al. |
| 5,509,558 A | 4/1996 | Imai et al. |
| 5,512,078 A | 4/1996 | Griffin |
| 5,518,593 A | 5/1996 | Hoskawa et al. |
| 5,520,740 A | 5/1996 | Kanai et al. |
| 5,531,835 A | 7/1996 | Fodor et al. |
| 5,542,559 A | 8/1996 | Kawakami et al. |
| 5,549,802 A | 8/1996 | Guo |
| 5,587,039 A | 12/1996 | Salimian et al. |
| 5,595,583 A | 1/1997 | Murnick |
| 5,605,637 A | 2/1997 | Shan et al. |
| 5,614,055 A | 3/1997 | Fairbairn et al. |
| 5,614,071 A | 3/1997 | Mahvan et al. |
| 5,643,422 A | 7/1997 | Yamada |
| 5,658,442 A | 8/1997 | Van Gogh et al. |
| 5,660,640 A | 8/1997 | Laube |
| 5,671,835 A | 9/1997 | Tanaka et al. |
| 5,684,669 A | 11/1997 | Collins et al. |
| 5,685,914 A | 11/1997 | Hills et al. |
| 5,685,959 A | 11/1997 | Bourez et al. |
| 5,690,795 A | 11/1997 | Rosenstein et al. |
| 5,695,825 A | 12/1997 | Scruggs |
| 5,700,179 A | 12/1997 | Hasegawa et al. |
| 5,714,010 A | 2/1998 | Matsuyama et al. |
| 5,720,818 A | 2/1998 | Donde et al. |
| 5,736,021 A | 4/1998 | Ding et al. |
| 5,745,331 A | 4/1998 | Shamoulian et al. |
| 5,748,434 A | 5/1998 | Rossman et al. |
| 5,755,887 A | 5/1998 | Sano et al. |
| 5,762,748 A | 6/1998 | Banholzer et al. |
| 5,763,851 A | 6/1998 | Forster et al. |
| 5,792,562 A | 8/1998 | Collins et al. |
| 5,800,686 A | 9/1998 | Littau et al. |
| 5,803,977 A | 9/1998 | Tepman et al. |
| 5,808,270 A | 9/1998 | Marantz et al. |
| 5,810,931 A | 9/1998 | Stevens et al. |
| 5,812,362 A | 9/1998 | Ravi |
| 5,821,166 A | 10/1998 | Hajime et al. |
| 5,824,197 A | 10/1998 | Tanaka |
| 5,830,327 A | 11/1998 | Kolnekow |
| 5,840,434 A | 11/1998 | Kojima et al. |
| 5,855,687 A | 1/1999 | DuBois et al. |
| 5,858,100 A | 1/1999 | Maeda et al. |
| 5,868,847 A | 2/1999 | Chen et al. |
| 5,876,573 A | 3/1999 | Moslehi et al. |
| 5,879,523 A | 3/1999 | Wang et al. |
| 5,879,524 A | 3/1999 | Hurwitt et al. |
| 5,885,428 A | 3/1999 | Kogan |
| 5,886,863 A | 3/1999 | Nagasaki et al. |
| 5,893,643 A | 4/1999 | Kumar et al. |
| 5,901,751 A | 5/1999 | Huo |
| 5,903,428 A | 5/1999 | Grimard et al. |
| 5,910,338 A | 6/1999 | Donde et al. |
| 5,916,378 A | 6/1999 | Bailey et al. |
| 5,916,454 A | 6/1999 | Richardson et al. |
| 5,920,764 A | 7/1999 | Hanson |
| 5,922,133 A | 7/1999 | Tepman et al. |
| 5,930,661 A | 7/1999 | Lu |
| 5,939,146 A | 8/1999 | Lavernia |
| 5,942,041 A | 8/1999 | Lo et al. |
| 5,942,445 A | 8/1999 | Kato et al. |
| 5,948,288 A | 9/1999 | Treves et al. |
| 5,951,374 A | 9/1999 | Kato et al. |
| 5,951,775 A | 9/1999 | Tepman |
| 5,953,827 A | 9/1999 | Or et al. |
| 5,963,778 A | 10/1999 | Stellrecht |
| 5,967,047 A | 10/1999 | Kuhn et al. |
| 5,976,327 A | 11/1999 | Tanaka |
| 5,985,033 A | 11/1999 | Yudovsky et al. |
| 6,000,415 A | 12/1999 | Huo et al. |
| 6,010,583 A | 1/2000 | Annavarapu et al. |
| 6,014,979 A | 1/2000 | Van Autryve et al. |
| 6,015,465 A | 1/2000 | Kholodenko et al. |
| 6,026,666 A | 2/2000 | Zimmermann et al. |
| 6,027,604 A | 2/2000 | Lim et al. |
| 6,036,587 A | 3/2000 | Tolles et al. |
| 6,051,114 A | 4/2000 | Yao et al. |
| 6,051,122 A | 4/2000 | Flanigan |
| 6,059,945 A | 5/2000 | Fu et al. |
| 6,071,389 A | 6/2000 | Zhang |
| 6,073,830 A | 6/2000 | Hunt et al. |
| 6,086,735 A | 7/2000 | Gilman et al. |
| 6,095,084 A | 8/2000 | Shamouilian et al. |
| 6,096,135 A | 8/2000 | Guo et al. |
| 6,103,069 A | 8/2000 | Davenport |
| 6,103,070 A | 8/2000 | Hong |

(56) References Cited

U.S. PATENT DOCUMENTS

| | | |
|---|---|---|
| 6,106,625 A | 8/2000 | Koai et al. |
| 6,108,189 A | 8/2000 | Weldon et al. |
| 6,120,621 A | 9/2000 | Jin et al. |
| 6,120,640 A | 9/2000 | Shih et al. |
| 6,123,804 A | 9/2000 | Babassi et al. |
| 6,132,566 A | 10/2000 | Hofmann et al. |
| 6,143,086 A | 11/2000 | Tepman |
| 6,143,432 A | 11/2000 | de Rochemont et al. |
| 6,146,509 A | 11/2000 | Aragon |
| 6,149,784 A | 11/2000 | Su et al. |
| 6,150,762 A | 11/2000 | Kim et al. |
| 6,152,071 A | 11/2000 | Akiyama et al. |
| 6,156,124 A | 12/2000 | Tobin |
| 6,159,299 A | 12/2000 | Koai et al. |
| 6,162,297 A | 12/2000 | Mintz et al. |
| 6,162,336 A | 12/2000 | Lee |
| 6,168,668 B1 | 1/2001 | Yudovsky |
| 6,170,429 B1 | 1/2001 | Schoepp et al. |
| 6,176,981 B1 | 1/2001 | Hong et al. |
| 6,183,614 B1 | 2/2001 | Fu |
| 6,183,686 B1 | 2/2001 | Bardus et al. |
| 6,190,513 B1 | 2/2001 | Forster et al. |
| 6,190,516 B1 | 2/2001 | Xiong et al. |
| 6,198,067 B1 | 3/2001 | Ikeda et al. |
| 6,199,259 B1 | 3/2001 | Demaray et al. |
| 6,210,539 B1 | 4/2001 | Tanaka et al. |
| 6,221,217 B1 | 4/2001 | Moslehi et al. |
| 6,227,435 B1 | 5/2001 | Lazarz et al. |
| 6,235,163 B1 | 5/2001 | Angelo et al. |
| 6,238,528 B1 | 5/2001 | Xu et al. |
| 6,248,667 B1 | 6/2001 | Kim et al. |
| 6,250,251 B1 | 6/2001 | Akiyama et al. |
| 6,251,720 B1 | 6/2001 | Thakur et al. |
| 6,254,737 B1 | 7/2001 | Edelstein et al. |
| 6,258,170 B1 | 7/2001 | Somekh et al. |
| 6,258,440 B1 | 7/2001 | Aihara et al. |
| 6,264,812 B1 | 7/2001 | Raaijmakers et al. |
| 6,269,670 B2 | 8/2001 | Koestermeier |
| 6,270,859 B2 | 8/2001 | Zhao et al. |
| 6,274,008 B1 | 8/2001 | Gopalraja et al. |
| 6,276,997 B1 | 8/2001 | Li |
| 6,280,584 B1 | 8/2001 | Kumar et al. |
| 6,284,093 B1 | 9/2001 | Ke et al. |
| 6,287,437 B1 | 9/2001 | Pandhumsoporn et al. |
| 6,299,740 B1 | 10/2001 | Hieronymi et al. |
| 6,306,489 B1 | 10/2001 | Hellmann et al. |
| 6,306,498 B1 | 10/2001 | Yuuki et al. |
| 6,328,808 B1 | 12/2001 | Tsai et al. |
| 6,338,781 B1 | 1/2002 | Sichmann et al. |
| 6,338,906 B1 | 1/2002 | Ritland et al. |
| 6,340,415 B1 | 1/2002 | Raaijmakers et al. |
| 6,344,114 B1 | 2/2002 | Sichmann et al. |
| 6,346,352 B1 | 2/2002 | Hayden et al. |
| 6,358,376 B1 | 3/2002 | Wang et al. |
| 6,364,957 B1 | 4/2002 | Schneider et al. |
| 6,365,010 B1 | 4/2002 | Hollars |
| 6,368,469 B1 | 4/2002 | Nulman et al. |
| 6,372,609 B1 | 4/2002 | Aga |
| 6,374,512 B1 | 4/2002 | Guo et al. |
| 6,379,575 B1 | 4/2002 | Yin et al. |
| 6,383,459 B1 | 5/2002 | Singh et al. |
| 6,387,809 B2 | 5/2002 | Toyama |
| 6,391,146 B1 | 5/2002 | Bhatnagar et al. |
| 6,394,023 B1 | 5/2002 | Crocker |
| 6,398,929 B1 | 6/2002 | Chiang et al. |
| 6,401,652 B1 | 6/2002 | Mohn et al. |
| 6,416,634 B1 | 7/2002 | Mostovoy et al. |
| 6,423,175 B1 | 7/2002 | Huang et al. |
| 6,432,203 B1 | 8/2002 | Black et al. |
| 6,436,192 B2 | 8/2002 | Chen et al. |
| 6,440,221 B2 | 8/2002 | Shamouilian et al. |
| 6,444,083 B1 | 9/2002 | Steger et al. |
| 6,447,853 B1 | 9/2002 | Suzuki et al. |
| 6,454,870 B1 | 9/2002 | Brooks |
| 6,475,336 B1 | 11/2002 | Hubacek |
| 6,484,794 B1 | 11/2002 | Schulak et al. |
| 6,486,020 B1 | 11/2002 | Thakur et al. |
| 6,497,797 B1 | 12/2002 | Kim |
| 6,500,321 B1 | 12/2002 | Ashtiani et al. |
| 6,503,331 B1 | 1/2003 | Yudovsky et al. |
| 6,506,290 B1 | 1/2003 | Ono |
| 6,506,312 B1 | 1/2003 | Bottomfield |
| 6,544,914 B1 | 4/2003 | Kikugawa et al. |
| 6,545,267 B1 | 4/2003 | Miura et al. |
| 6,555,471 B2 | 4/2003 | Sandhu et al. |
| 6,558,505 B2 | 5/2003 | Suzuki et al. |
| 6,565,984 B1 | 5/2003 | Wu et al. |
| 6,566,161 B1 | 5/2003 | Rosenberg et al. |
| 6,572,732 B2 | 6/2003 | Collins |
| 6,576,909 B2 | 6/2003 | Donaldson et al. |
| 6,579,431 B1 | 6/2003 | Bolcavage et al. |
| 6,589,407 B1 | 7/2003 | Subramani et al. |
| 6,599,405 B2 | 7/2003 | Hunt et al. |
| 6,605,177 B2 | 8/2003 | Mett et al. |
| 6,619,537 B1 | 9/2003 | Zhang et al. |
| 6,620,736 B2 | 9/2003 | Drewery |
| 6,623,595 B1 | 9/2003 | Han et al. |
| 6,623,596 B1 | 9/2003 | Collins et al. |
| 6,623,597 B1 | 9/2003 | Han et al. |
| 6,623,610 B1 | 9/2003 | Onishi |
| 6,627,050 B2 | 9/2003 | Miller et al. |
| 6,627,056 B2 | 9/2003 | Wang et al. |
| H2087 H | 11/2003 | Balliett et al. |
| 6,645,357 B2 | 11/2003 | Powell |
| 6,652,668 B1 | 11/2003 | Perry et al. |
| 6,652,716 B2 | 11/2003 | Kao et al. |
| 6,660,135 B2 | 12/2003 | Yu et al. |
| 6,667,577 B2 | 12/2003 | Shannon et al. |
| 6,673,199 B1 | 1/2004 | Yamartino et al. |
| 6,676,812 B2 | 1/2004 | Chung |
| 6,682,627 B2 | 1/2004 | Shamouilian et al. |
| 6,689,249 B2 | 2/2004 | Ke et al. |
| 6,689,252 B1 | 2/2004 | Shamouilian et al. |
| 6,708,870 B2 | 3/2004 | Koenigsmann et al. |
| 6,723,214 B2 | 4/2004 | Stimson et al. |
| 6,726,805 B2 | 4/2004 | Brown et al. |
| 6,730,174 B2 | 5/2004 | Liu et al. |
| 6,743,340 B2 | 6/2004 | Fu |
| 6,749,103 B1 | 6/2004 | Ivanov et al. |
| 6,776,879 B2 | 8/2004 | Yamamoto et al. |
| 6,777,045 B2 | 8/2004 | Lin et al. |
| 6,783,639 B2 | 8/2004 | Nulman et al. |
| 6,794,703 B1 | 9/2004 | Thakur et al. |
| 6,797,362 B2 | 9/2004 | Parfeniuk et al. |
| 6,797,639 B2 | 9/2004 | Carducci et al. |
| 6,811,657 B2 | 11/2004 | Jaso |
| 6,812,471 B2 | 11/2004 | Popiolkowski et al. |
| 6,824,612 B2 | 11/2004 | Stevens et al. |
| 6,824,652 B2 | 11/2004 | Park |
| 6,837,968 B2 | 1/2005 | Brown et al. |
| 6,840,427 B2 | 1/2005 | Ivanov |
| 6,846,396 B2 | 1/2005 | Perrin |
| 6,858,116 B2 | 2/2005 | Okabe et al. |
| 6,872,284 B2 | 3/2005 | Ivanov et al. |
| 6,902,627 B2 | 6/2005 | Brueckner et al. |
| 6,902,628 B2 | 6/2005 | Wang et al. |
| 6,916,407 B2 | 7/2005 | Vosser et al. |
| 6,933,025 B2 | 8/2005 | Lin et al. |
| 6,933,508 B2 | 8/2005 | Popiolkowski et al. |
| 6,942,929 B2 | 9/2005 | Han et al. |
| 6,955,748 B2 | 10/2005 | Kim |
| 6,955,852 B2 | 10/2005 | Ivanov |
| 6,992,261 B2 | 1/2006 | Kachalov et al. |
| 7,026,009 B2 | 4/2006 | Lin et al. |
| 7,041,200 B2 | 5/2006 | Le et al. |
| 7,049,612 B2 | 5/2006 | Quach et al. |
| 7,063,773 B2 | 6/2006 | Ivanov et al. |
| 7,097,744 B2 | 8/2006 | Liu et al. |
| 7,121,938 B2 | 10/2006 | Suzuki |
| 7,131,883 B2 | 11/2006 | Park et al. |
| 7,141,138 B2 | 11/2006 | Gondhalekar et al. |
| 7,146,703 B2 | 12/2006 | Ivanov |
| 7,223,323 B2 | 5/2007 | Yang et al. |
| 7,264,679 B2 | 9/2007 | Schweitzer et al. |

(56) References Cited

U.S. PATENT DOCUMENTS

| | | |
|---|---|---|
| 7,294,224 B2 | 11/2007 | Vesci et al. |
| 7,294,245 B2 | 11/2007 | Fu |
| 7,407,565 B2 | 8/2008 | Wang et al. |
| 7,504,008 B2 | 3/2009 | Doan et al. |
| 7,579,067 B2 | 8/2009 | Lin et al. |
| 7,604,708 B2 | 10/2009 | Wood et al. |
| 7,618,769 B2 | 11/2009 | Brueckner et al. |
| 2001/0001367 A1 | 5/2001 | Koestermeier |
| 2001/0033706 A1 | 10/2001 | Shimomura et al. |
| 2001/0045353 A1 | 11/2001 | Hieronymi et al. |
| 2002/0029745 A1 | 3/2002 | Nagaiwa et al. |
| 2002/0033330 A1 | 3/2002 | Demaray et al. |
| 2002/0066531 A1 | 6/2002 | Ke et al. |
| 2002/0076490 A1 | 6/2002 | Chiang et al. |
| 2002/0086118 A1 | 7/2002 | Chang et al. |
| 2002/0090464 A1 | 7/2002 | Jiang et al. |
| 2002/0092618 A1 | 7/2002 | Collins |
| 2002/0100680 A1 | 8/2002 | Yamamoto et al. |
| 2003/0000647 A1 | 1/2003 | Yudovsky |
| 2003/0006008 A1 | 1/2003 | Horioka et al. |
| 2003/0019746 A1 | 1/2003 | Ford et al. |
| 2003/0026917 A1 | 2/2003 | Lin et al. |
| 2003/0029568 A1 | 2/2003 | Brown et al. |
| 2003/0037883 A1 | 2/2003 | Mett et al. |
| 2003/0047464 A1 | 3/2003 | Sun et al. |
| 2003/0077199 A1 | 4/2003 | Sandlin et al. |
| 2003/0085121 A1 | 5/2003 | Powell |
| 2003/0108680 A1 | 6/2003 | Gell et al. |
| 2003/0116276 A1 | 6/2003 | Weldon et al. |
| 2003/0118731 A1 | 6/2003 | He et al. |
| 2003/0127319 A1 | 7/2003 | Demaray et al. |
| 2003/0136428 A1 | 7/2003 | Krogh |
| 2003/0168168 A1 | 9/2003 | Liu et al. |
| 2003/0170486 A1 | 9/2003 | Austin et al. |
| 2003/0173526 A1 | 9/2003 | Popiolkowski et al. |
| 2003/0185965 A1 | 10/2003 | Lin et al. |
| 2003/0188685 A1 | 10/2003 | Wang et al. |
| 2003/0196890 A1 | 10/2003 | Le et al. |
| 2003/0217693 A1 | 11/2003 | Rattner et al. |
| 2003/0218054 A1 | 11/2003 | Koenigsmann et al. |
| 2003/0221702 A1 | 12/2003 | Peebles |
| 2004/0016637 A1 | 1/2004 | Yang et al. |
| 2004/0026233 A1 | 2/2004 | Perrin |
| 2004/0031677 A1 | 2/2004 | Wang et al. |
| 2004/0045574 A1 | 3/2004 | Tan |
| 2004/0056070 A1 | 3/2004 | Ivanov |
| 2004/0056211 A1 | 3/2004 | Popiolkowski et al. |
| 2004/0079634 A1 | 4/2004 | Wickersham et al. |
| 2004/0083977 A1 | 5/2004 | Brown et al. |
| 2004/0099285 A1 | 5/2004 | Wang et al. |
| 2004/0113364 A1 | 6/2004 | Ivanov |
| 2004/0118521 A1 | 6/2004 | Pancham et al. |
| 2004/0126952 A1 | 7/2004 | Gondhalekar et al. |
| 2004/0163669 A1 | 8/2004 | Brueckner et al. |
| 2004/0180158 A1 | 9/2004 | Lin et al. |
| 2004/0222088 A1 | 11/2004 | Subramani et al. |
| 2004/0231798 A1 | 11/2004 | Gondhalekar et al. |
| 2004/0251130 A1 | 12/2004 | Liu et al. |
| 2004/0256226 A1 | 12/2004 | Wickersham |
| 2004/0261946 A1 | 12/2004 | Endoh et al. |
| 2005/0011749 A1 | 1/2005 | Kachalov et al. |
| 2005/0028838 A1 | 2/2005 | Brueckner |
| 2005/0048876 A1 | 3/2005 | West et al. |
| 2005/0061857 A1 | 3/2005 | Hunt et al. |
| 2005/0067469 A1 | 3/2005 | Facey et al. |
| 2005/0089699 A1 | 4/2005 | Lin et al. |
| 2005/0092604 A1 | 5/2005 | Ivanov |
| 2005/0098427 A1 | 5/2005 | Cho et al. |
| 2005/0147150 A1 | 7/2005 | Wickersham et al. |
| 2005/0161322 A1 | 7/2005 | Smathers |
| 2005/0172984 A1 | 8/2005 | Schweitzer et al. |
| 2005/0178653 A1 | 8/2005 | Fisher |
| 2005/0211548 A1 | 9/2005 | Gung et al. |
| 2005/0238807 A1 | 10/2005 | Lin |
| 2005/0271984 A1 | 12/2005 | Brueckner et al. |
| 2005/0282358 A1 | 12/2005 | Di Cioccio et al. |
| 2005/0284372 A1 | 12/2005 | Murugesh et al. |
| 2006/0005767 A1 | 1/2006 | Tsai et al. |
| 2006/0021870 A1 | 2/2006 | Tsai et al. |
| 2006/0070876 A1 | 4/2006 | Wu et al. |
| 2006/0090706 A1 | 5/2006 | Miller et al. |
| 2006/0105182 A1 | 5/2006 | Brueckner et al. |
| 2006/0108217 A1 | 5/2006 | Krempel-Hesse et al. |
| 2006/0188742 A1 | 8/2006 | West et al. |
| 2006/0251822 A1 | 11/2006 | Gell et al. |
| 2006/0283703 A1 | 12/2006 | Lee et al. |
| 2007/0059460 A1 | 3/2007 | Abney et al. |
| 2007/0062452 A1 | 3/2007 | Pancham et al. |
| 2007/0102286 A1 | 5/2007 | Scheible et al. |
| 2007/0113783 A1 | 5/2007 | Lee et al. |
| 2007/0125646 A1 | 6/2007 | Young et al. |
| 2007/0170052 A1 | 7/2007 | Ritchie et al. |
| 2007/0173059 A1 | 7/2007 | Young et al. |
| 2007/0215463 A1 | 9/2007 | Parkhe et al. |
| 2007/0274876 A1 | 11/2007 | Chiu et al. |
| 2007/0283884 A1 | 12/2007 | Tiller et al. |
| 2008/0038481 A1 | 2/2008 | West et al. |
| 2008/0066785 A1 | 3/2008 | Vesci et al. |
| 2008/0110760 A1 | 5/2008 | Han et al. |
| 2008/0141942 A1 | 6/2008 | Brown et al. |
| 2008/0178801 A1 | 7/2008 | Pavloff et al. |
| 2008/0257263 A1 | 10/2008 | Pavloff et al. |
| 2008/0295872 A1 | 12/2008 | Riker et al. |
| 2009/0084317 A1 | 4/2009 | Wu et al. |
| 2009/0120462 A1 | 5/2009 | West et al. |
| 2009/0121604 A1 | 5/2009 | Stahr et al. |

FOREIGN PATENT DOCUMENTS

| | | |
|---|---|---|
| EP | 0439000 | 7/1991 |
| EP | 0601788 | 6/1994 |
| EP | 0610556 | 8/1994 |
| EP | 0635869 | 1/1995 |
| EP | 0791956 | 8/1997 |
| EP | 0818803 A | 1/1998 |
| EP | 0838838 | 4/1998 |
| EP | 0845545 | 6/1998 |
| EP | 1049133 A2 | 11/2000 |
| EP | 1094496 A | 4/2001 |
| EP | 1158072 A2 | 11/2001 |
| EP | 1258908 A2 | 11/2002 |
| FR | 2562097 | 10/1985 |
| GB | 1424365 A | 2/1976 |
| JP | 54-162969 | 12/1979 |
| JP | 54162696 | 12/1979 |
| JP | 11-59368 | 12/1987 |
| JP | 63235435 | 9/1988 |
| JP | 02-027748 | 1/1990 |
| JP | 02-101157 | 4/1990 |
| JP | 03-138354 | 6/1991 |
| JP | 06-232243 | 8/1994 |
| JP | 07-197272 | 8/1995 |
| JP | 09-017850 | 1/1997 |
| JP | 09-272965 | 10/1997 |
| JP | 10-045461 | 2/1998 |
| JP | 63149396 | 6/1998 |
| JP | 10-251871 | 9/1998 |
| JP | 10-330971 | 12/1998 |
| JP | 11-137440 | 5/1999 |
| JP | 11-220164 | 8/1999 |
| JP | 11-283972 | 10/1999 |
| JP | 2000-228398 | 10/1999 |
| JP | 2250990 | 10/1999 |
| JP | 11-345780 | 12/1999 |
| JP | 2000-072529 | 3/2000 |
| JP | 2000-191370 | 7/2000 |
| JP | 2002-69695 | 3/2002 |
| TW | 546680 | 8/2003 |
| WO | WO-9523428 | 8/1995 |
| WO | WO-9708734 | 3/1997 |
| WO | WO-9742648 | 11/1997 |
| WO | WO-98/50599 | 11/1998 |
| WO | WO-9852208 | 11/1998 |
| WO | WO-9903131 | 1/1999 |

(56) References Cited

FOREIGN PATENT DOCUMENTS

| WO | WO-9913126 | 3/1999 |
|----|----|----|
| WO | WO-9913545 | 3/1999 |
| WO | WO-9914788 | 3/1999 |
| WO | WO-99/17336 | 4/1999 |
| WO | WO-9928945 | 6/1999 |
| WO | WO-9941426 | 8/1999 |
| WO | WO-0005751 | 2/2000 |
| WO | WO-0026939 | 5/2000 |
| WO | WO-0184590 | 11/2001 |
| WO | WO-0184624 A2 | 11/2001 |
| WO | WO-0215255 | 2/2002 |
| WO | WO-0223587 | 3/2002 |
| WO | WO 02/093624 | 11/2002 |
| WO | WO-03015137 | 2/2003 |
| WO | WO-03057943 | 7/2003 |
| WO | WO-03076683 | 9/2003 |
| WO | WO-03083160 | 10/2003 |
| WO | WO-03087427 | 10/2003 |
| WO | WO-03090248 | 10/2003 |
| WO | WO-2004/010494 A2 | 1/2004 |
| WO | WO-2004012242 | 2/2004 |
| WO | WO-2004015736 | 2/2004 |
| WO | WO-2004074932 | 9/2004 |
| WO | WO-2004094702 | 11/2004 |
| WO | WO-2005021173 | 3/2005 |
| WO | WO 2005/071137 | 8/2005 |
| WO | WO-2006053231 | 5/2006 |
| WO | WO-2006073585 | 7/2006 |
| WO | WO-2007-030824 | 3/2007 |
| WO | WO-2007/008999 | 4/2007 |
| WO | WO 2008/079722 | 7/2008 |
| WO | WO-2008079722 | 7/2008 |
| WO | WO-2008-133876 | 11/2008 |
| WO | WO-2008-153785 | 12/2008 |
| WO | WO-2008/156794 | 12/2008 |

OTHER PUBLICATIONS

Rosenberg, RW, "Increasing PVD Tool Uptime and Particle Control with Twin-Wire-Arc Spray Coatings", Mar. 2001, p. 103-105, 108, 11, vol. 19, No. 3, Cannon Comm., Santa Monica, CA.

Tucker, Jr., Robert C., "Plasma and Detonation Gun Deposition Techniques and Coating Properties," Union Carbide Corp., Coatings Service Dept., Indianapolis, IN, pp. 454-489.

Watanabe, et al., "Effect of Additives on the Electrostatic Force of Alumina Electrostatic Chucks," J. of the Ceramic Soc. of Jpn., 100(1):1-6 (1992).

Watanabe, et al., "Electrostatic Force and Absorption Current of Alumina Electrostatic Chucks," Jpn. J. Appl. Phy., 31(Pt1, No. 7):2145-2150 (1992).

Watanabe, et al., "Relationship Between Electrical Resistivity and Electrostatic Force of Alumina Electrostatic Chuck," Jpn. J. Appl. Phy., 32(Pt1, No. 2):864-871 (1993).

Watanabe, et al., "Resistivity and Microstructure of Alumina Ceramics Added with TiO2 Fired in Reducing Atmosphere," J. of the Ceramic Doc. of Jpn. Int. Ed., 101-1076-1083.

Wright et al., "Low Temperature Etch Chuck: Modeling and Experimental Results of Heat Transfer and Wafer Temperature," J. Vac. Sci. Technol. A, 10(4):1065-1070(Jul./Aug. 1992).

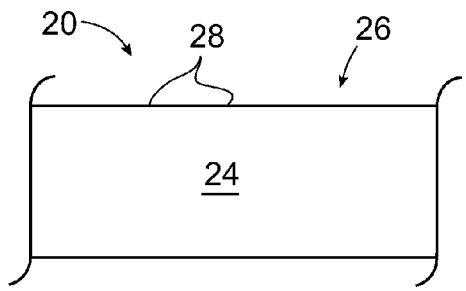
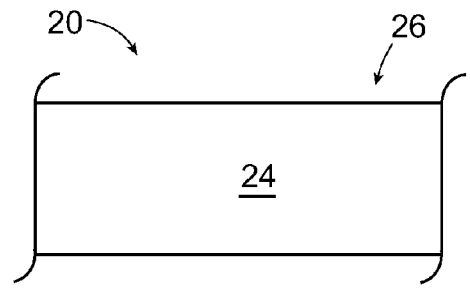
FIG. 1A
FIG. 1B
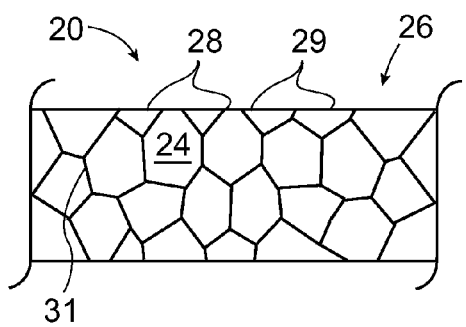
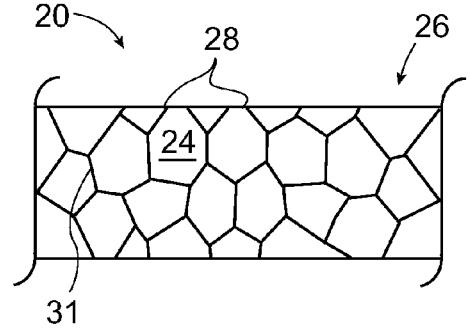
FIG. 1C
FIG. 1D
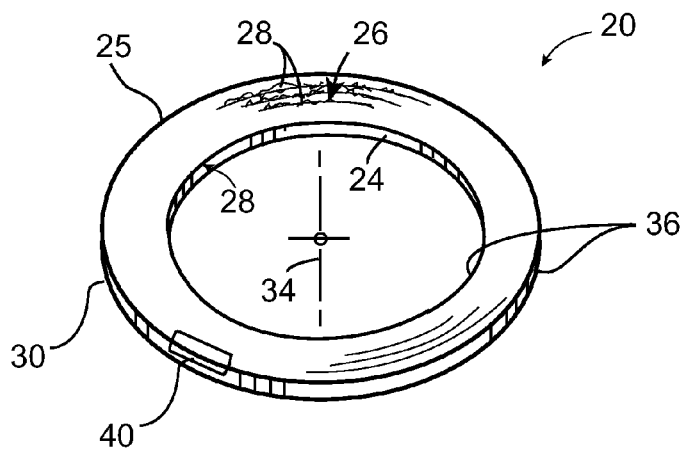
FIG. 2

SURFACE ANNEALING OF COMPONENTS FOR SUBSTRATE PROCESSING CHAMBERS

CROSS-REFERENCE

This application is a divisional of application Ser. No. 11/181,041, entitled "LOCALIZED SURFACE ANNEALING OF COMPONENTS FOR SUBSTRATE PROCESSING CHAMBERS", filed on Jul. 13, 2005, which is incorporated by reference herein in its entirety.

BACKGROUND

Embodiments of the present invention relate to components for substrate processing chambers.

A substrate processing chamber is used to process a substrate such as for example, a semiconductor wafer or display, in an energized process gas. The processing chamber typically comprises an enclosure wall that encloses a process zone into which a gas is introduced and energized. The chamber may be used to deposit material on the substrate by chemical or physical vapor deposition, etch material from a substrate, implant material on a substrate, or convert substrate layers such as by oxidizing layers or forming nitrides. The chamber typically includes a number of internal chamber components such as for example, a substrate support, gas distributor, gas energizer, and different types of liners and shields. For example, the liners and shields can be cylindrical members surrounding the substrate to serve as focus rings to direct and contain plasma about the substrate, deposition rings that prevent deposition on underlying components or portions of the substrate, substrate shields, and chamber wall liners.

Ceramic materials are often used to form the internal chamber components, especially those components that are exposed to the energized gas or plasma, and consequently, are subject to high temperatures and erosion. Ceramic materials such as alumina and silica are crystalline whereas silica glasses have no long range order. Ceramics typically exhibit good resistance to erosion by the energized gases, and consequently, do not have to be replaced as often as metal alloys. Ceramic components also reduce the generation of particles in the chamber that result from the erosion of components. Ceramic components can also withstand high temperatures without thermal degradation. Quartz components are particularly useful for plasmas that would corrode other materials, such as plasmas containing fluorine species.

However, ceramic materials are subject to brittle failure modes and often crack or chip in use in the chamber or during handling in the replacement or cleaning of the component. Amorphous and microcrystalline materials are particularly susceptible to brittle failure through crack propagation. In amorphous materials, such as glass, surface microcracks propagate on an atomic level because glass has short-range order without any long-range order. Microcrystalline materials, such as quartz, have grains with a surface that can have intragranular microcracks that are through single grains, intergranular microcracks that extend around grains and along grain boundaries, as well as transgranular microcracks that cut across adjacent grains. Of these, the intergranular microcracks that extend around the microcrystalline grains of the quartz are generally the most culpable for crack propagation and often lead to chipping and cracking of the component.

Thus, it is desirable to have a ceramic component made from microcrystalline or amorphous ceramics that exhibits reduced chipping and cracking. It is further desirable to fabricate such ceramic components with lower failure rates during use. It is also desirable for the ceramic components to be able to withstand the energized gas environment in the chamber without excessive erosion or thermal degradation.

SUMMARY

A method of fabricating a processing chamber component comprises forming a processing chamber component having a structural body with surface regions having microcracks, and directing a laser beam onto the microcracks of the surface regions of the structural body for a sufficient time to heal and close off the microcracks by themselves.

A method of fabricating a substrate processing chamber component comprises forming a processing chamber component having a structural body with surface regions having microcracks with crack surfaces, and annealing the microcracks to heal and close off the microcracks by themselves such that the crack surfaces of each microcrack are in contact with one another.

A method of fabricating a substrate processing chamber component comprises forming a processing chamber component having a structural body with localized surface regions having microcracks with crack surfaces. The microcracks are annealed by directing a laser beam on the localized surface regions for a sufficient time to heal and close off the microcracks by themselves such that (i) the crack surfaces of each microcrack are in contact with one another, and (ii) the annealed structural body has a mean Vickers hardness that is at least about 10% higher than the Vickers hardness of the untreated structural body.

DRAWINGS

These features, aspects, and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

FIG. 1A is a cross-sectional schematic view of a chamber component made from glass showing microcracks in the surface of the glass;

FIG. 1B is a cross-sectional schematic view of the chamber component of FIG. 1A after localized laser treatment to anneal the surface microcracks;

FIG. 1C is a cross-sectional schematic view of a chamber component made from quartz showing microcracks along the grains and grain boundary regions of the quartz;

FIG. 1D is a cross-sectional schematic view of the chamber component of FIG. 1C after localized laser treatment to anneal the surface microcracks;

FIG. 2 is a perspective view of a quartz ring having a laser annealed surface;

DESCRIPTION

Figure 3A:
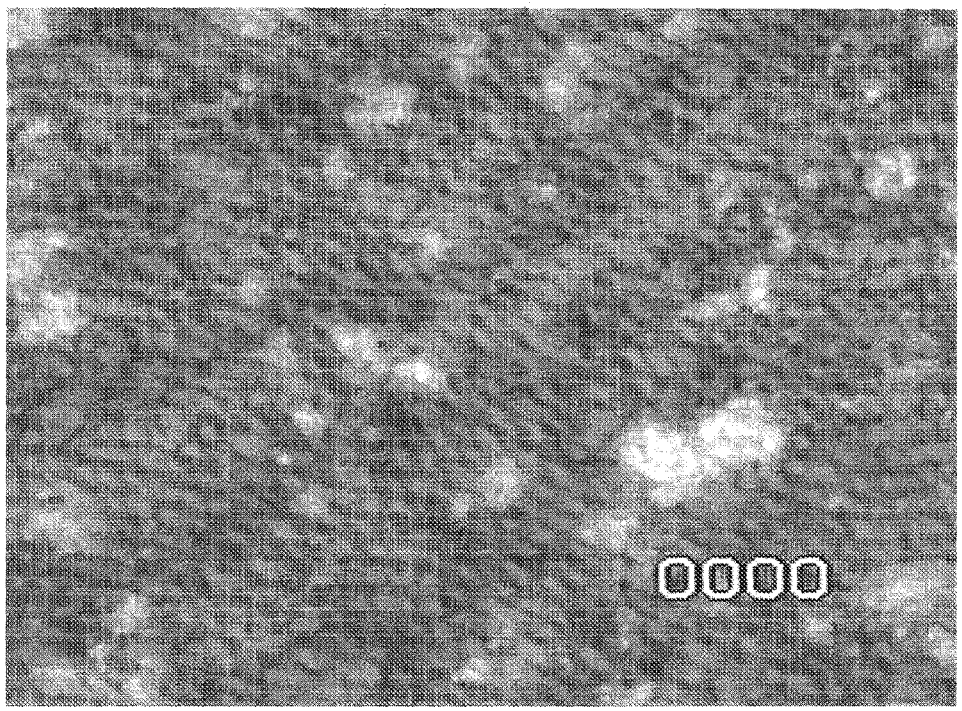
FIGS. 3A and 3B are optical microscopy images of a quartz surface with surface microcracks before and after laser treatment, respectively.

A substrate processing chamber component 20 comprises a structural body 24 with localized surface regions 26 having microcracks 28, as shown in FIGS. 1A to 1D. The chamber component 20 can be made from a ceramic, glass or glass ceramic material, such as for example, quartz, silica glass, aluminum oxide, titanium oxide, silicon nitride, zirconium oxide, and other such materials. The surface microcracks 28 are caused by fine dust or other abrasive materials that strike and abrade the component surface 26 during or after fabrication of the component. FIG. 1A shows a component 20 made from glass, which is amorphous and has short range atomic order but no long range atomic order. For example, silica glass has short range order within individual silica tetrahedrons with fixed silicon and oxygen bond angles, but the silica tetrahedral may be interconnected with random bond angles. In glass, the microcracks are very fine and terminate with atomic bonds. Microcrystalline ceramic materials, as shown in FIG. 1C, are polycrystalline with fine grains 29 having micron sized dimensions. In microcrystalline materials, the microcracks 28 typically extend around the fine grains 29 and or along grain boundaries 31, but they can also cut across single or adjacent grains 29. The surface microcracks 28 on the components 20 serve as stress concentrators that cause applied forces to concentrate on the tips of the microcracks 20. Because the dimensions of the microcracks 28 are very small, on the level of atomic bonds between atoms of the component material in glass materials, and on the level of micron sized grains in microcrystalline materials, the applied stress is magnified tremendously at the crack tip. This results in rapid catastrophic failure modes in which a portion of the component 20 can easily crack or chip away with even a small applied force or impact.

In one exemplary embodiment, the component 20 comprises a structural body 24 that is shaped as a ring 25, as schematically illustrated in FIG. 2. The ring 25 comprises the surface 26 having the microcracks 28. The ring 25 is annular with an internal sidewall 28 and an external sidewall 30. The internal sidewall 28 faces an internal axis 34 about which the structural body has rotational symmetry. The ring 25 is shaped to protect or conform to a section of a processing chamber, chamber component, or substrate within the chamber. For example, the component 20 can be a liner or shield that is a cylindrical member which is sized to fit around a substrate being processed in a chamber. The shield 20 can be a rig of quartz that surrounds the substrate. The component 20 can also be a deposition ring, shadow ring or cover ring. Yet other chamber components comprise chamber wall liners.

The surface microcracks 28 on the structural body 24 of the component 20 are annealed to heal and close off the microcracks as shown in FIGS. 1B and 1D, to reduce crack propagation and increase the fracture resistance of the component 20. In one embodiment, a laser beam is directed onto the localized surface regions 26 of the component 20 at a sufficiently high intensity and for a sufficient time to cause the region 26 about the microcracks 28 to soften and heal the microcracks 28. The laser beam is used to selectively heat the localized surface regions of the component 20. The localized surface regions 26 are those that are prone to fracture during use, or which have excessive microcracks during fabrication, for example, regions which are more readily subject to abrasion and grinding from applied external forces during the handling of manufacture of the component. Thus, the localized surface regions may be on the flat top surface of the ring 25. The localized surface regions 26 can also include those regions of the component 20 which are more susceptible to applied stresses during handling and use. For example, the edges 36 of the quartz rings 25 used in the chamber 20 are often chipped or cracked when the ring 25 is removed for cleaning or replacing after use for a predetermined number of process cycles. The edges 36, which may also include corners 40, are often easily cracked or chipped in use. Thus, increasing the fracture strength of the regions 26 of the quartz ring can significantly increase its process lifetime.

The energy of the laser beam and beam characteristics, such as focal length, beam shape and beam diameter, may be controlled to selectively heat a shallow portion of the localized surface region of the component 20 above the microcrack healing temperature needed for annealing the surface microcracks 28. In one embodiment, a laser beam is used to heat a thin surface layer having a depth of less than 500 microns, and more typically less the 100 microns, of the localized surface regions 26 of a component 20. The focused laser beam selectively heats the localized surface regions 26 of the component 20 to a temperature above the crack healing temperature without excessively raising the bulk temperature of the component, which may result in distortion or thermal fracture of the component 20. After heating the thin surface layer of the component 20, rapid quenching of the hot surface occurs simply by conduction of heat out of the surface into the ambient environment. Since only a very shallow portion of the localized surface region 26 is heated by the laser beam, the quench rate by natural conduction or convection is relatively fast.

While a laser beam heat treatment is described as an exemplary annealing process, other annealing processes can also be used. For example, alternative annealing processes include plasma jet heating, electrical arc heating, flame heating. Thus, the scope of the present invention should not be limited to the exemplary versions described herein, and the invention includes other localized surface annealing processes and apparatus as would be apparent to those of ordinary skill in the art.

The microcrack formation process is essentially partially or entirely reversed by the annealing step. The localized heat energy supplied to the microcracked surface by the laser causes softening and fluxing of the localized heated region causing the microcracks 28 to close and seal themselves off, as schematically shown in FIGS. 1B and 1D. It is believed that in amorphous or glassy materials, as shown in FIGS. 1A and 1B, the microcrack healing process is enhanced because atomic forces acting across the tips of the microcracks 28 tend to pull crack surfaces back into contact across the entire microcrack plane. In microcrystalline materials, as shown in FIGS. 1C and 1D, the grain boundary regions 31 often contain small amounts of impurities that act as fluxing agents causing more rapid fluxing and resultant healing of the microcrack surfaces.

Figure 3B:
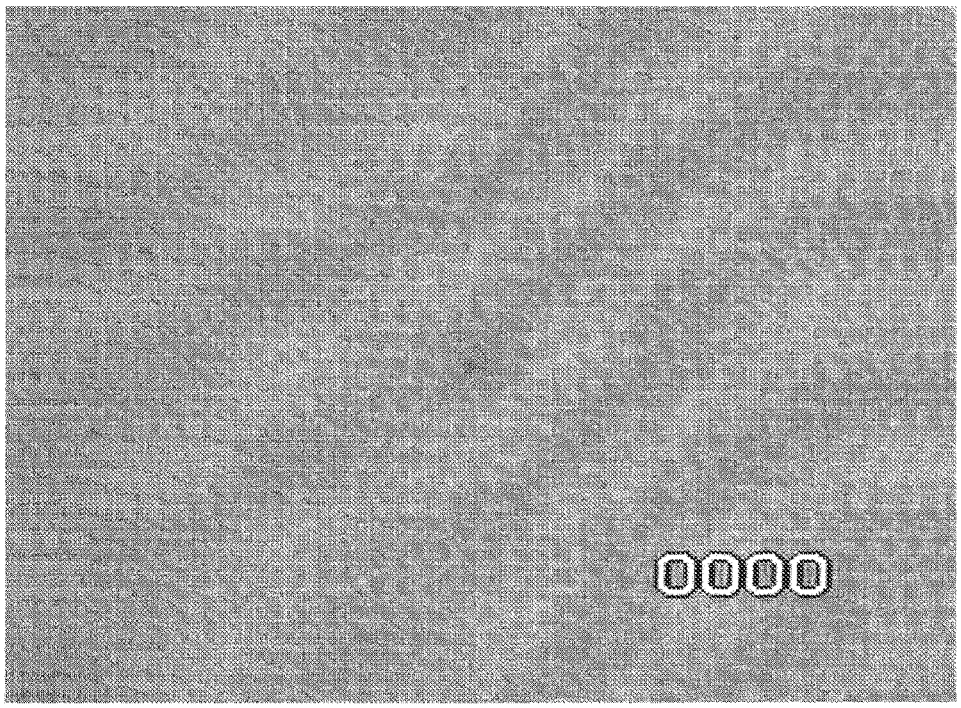

The effects of the laser annealing treatment are shown in FIGS. 3A and 3B, which are optical microscopy images of a quartz surface comprising surface microcracks before and after laser treatment, respectively. FIG. 3A shows the quartz surface with a large number of microcracks corresponding to the dark lines between the lighter grain surface regions. In FIG. 3B, which is a photo of the laser treated sample, it is seen that most of the surface microcracks have disappeared to provide a smooth and continuous surface. Note also that an indentation mark was artificially made at the center of the quartz specimen. However, the size of the indentation mark was on the order of the surface roughness of the quartz material, consequently, it is not visible in the original, un-treated quartz material shown in FIG. 3A. However, the partially healed indentation mark is visible as a faint dark spot in the photo of the laser treated sample of FIG. 3B, because the surface of the laser treated specimen is smooth and absent surface microcracks and roughness.

Annealing of surface microcracks of the chamber components was also found to substantially increase hardness and fracture stress of the annealed material, which would significantly improve its resistance to chipping and cracking. In the hardness test, an increasing load was applied normal to the plane of the specimen surface using a micro-indenter having a known geometrical shape. The load is then reduced until the surface of the specimen partially or completely relaxes, and a depth of indentation is then measured. The load is then progressively increased and the indentation and measurement process repeated until hardness is compromised and the specimen cracks. The Vickers hardness is computed using the formula $H=P_{max}/A_c$, where $P_{max}$ is the maximum load sustained before cracking and $A_c$ is the projected area of contact of the indenter. The hardness was measured using a Nano Hardness Tester. The load applied was on the order of a nano Newton and the displacement was accurately determined using a differential capacitor sensor. Both an original untreated quartz specimen and a laser annealed quartz specimen were measured. The mean Vickers hardness index for the untreated specimen was about 771.68, and the Vickers hardness index for the laser annealed quartz specimen had a mean of 951.68. Thus, the laser annealed quartz specimen had a Vickers hardness which was at least about 10%, and more preferably at least about 25% harder than the untreated specimen.

Another measurement demonstrating increased crack and chip resistance is a fracture stress measurement. Ceramic materials are often tested in a flexural or bending test instead of tensile test because of their brittle nature. The stress at which the ceramic material fails by fracture is called the fracture stress or fracture strength of the material. The fracture stress of untreated and laser annealed quartz specimens were compared from a 4-point bending test performed on the Universal Testing Machine according to ASTM C1161-90. The load at fracture and a cross-sectional area of the specimen was used to compute the stress fracture from the formula $\sigma=Load/wxt$, where wxt is cross sectional area over which the load is applied. The mean fracture stress of the untreated quartz specimens was 86.23 MPa and the mean fracture stress of the laser annealing quartz specimen was 132.27 MPa. Thus, the mean fracture stress of the laser annealed quartz specimen was at least about 25%, and more preferably, at least about 50% higher than that of the untreated specimen.

Thus, annealing of the microcracks 28 in localized surface regions 26 of a component 20 can significantly increase the surface smoothness, hardness, and fracture strength of the component 20. Absence or reduction of microcracks 28 in the surface of the component 20, especially in regions which are susceptible to applied stresses or are simply more fragile, such as projections, corners 40 and edges of the component, substantially increases the crack and chip resistance of the component 20. Advantageously, surface annealing allows healing and increased strength of selected surface regions 26 without subjecting the entire component 20 to elevated temperatures that may cause structural deformation or other thermal degradation. However, the entire component 20 may also be annealed by suitable heat treatment.

Figure 4:
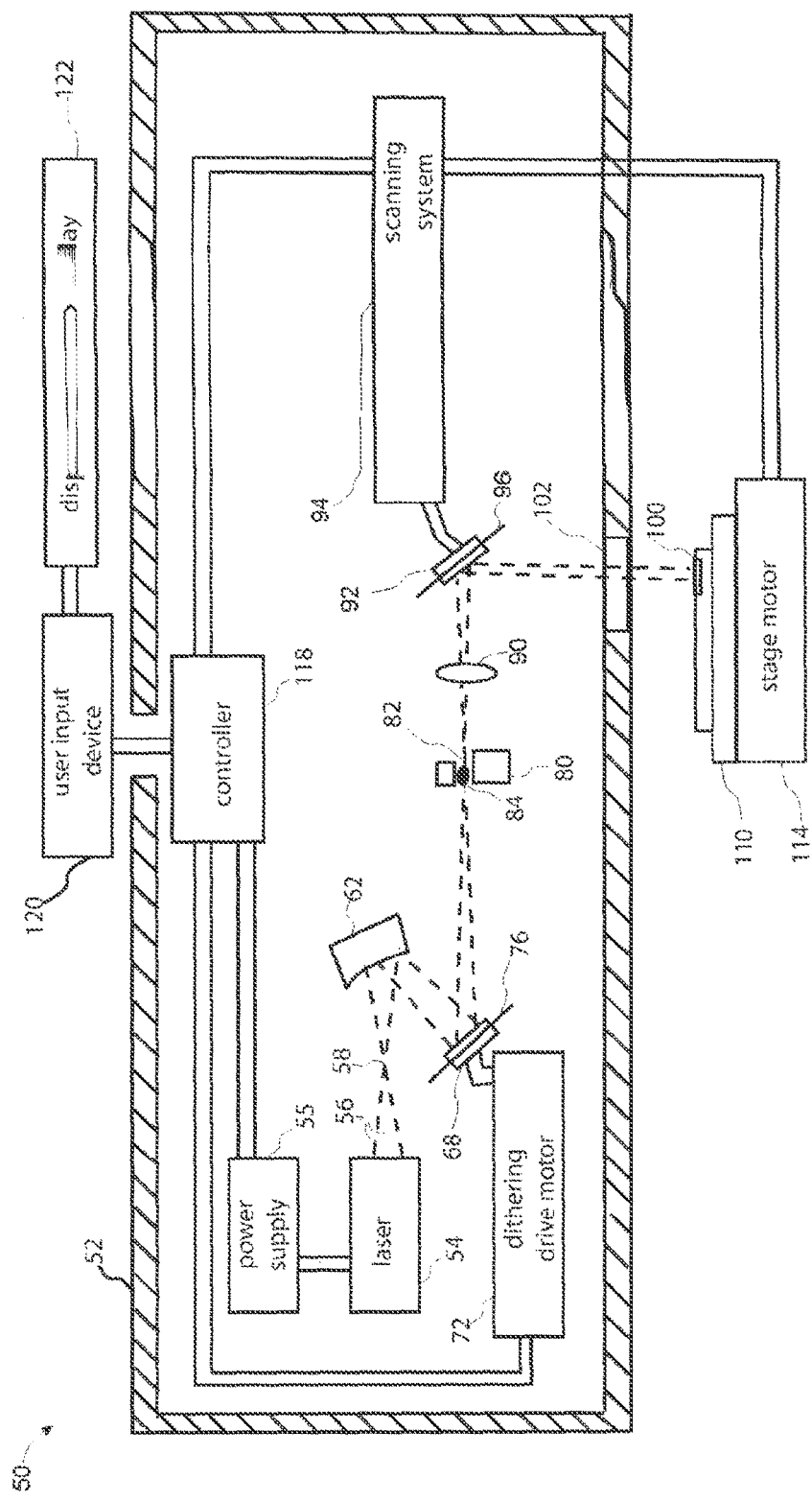
FIG. 4 is a schematic view of a laser annealing apparatus suitable for localized surface annealing of the chamber component.

Annealing of the microcracks 28 in localized surface regions 26 of the component 20 can be performed using a laser annealing apparatus 50, an exemplary embodiment of which is shown in FIG. 4. The laser annealing apparatus 50 comprises a laser beam enclosure 52 that encloses a laser beam source 54 powered by a power supply 55. Suitable laser beam sources 54 that can be used for microcrack annealing include, for example, Ar (argon), $CO_2$ and KrF lasers. An argon laser transmits in the visible wavelength at about 5145 angstroms. A $CO_2$ laser is an infra-red energy source having a wavelength of 10.6 µm, and can provide beams having a power of the order of 10 kilowatts. The $CO_2$ laser is 100× more efficient than the argon laser and is of greater intensity, allowing much faster scan speeds and larger spot sizes than the argon laser. A $CO_2$ laser is described in U.S. Pat. No. 3,702,973 issued on Nov. 14, 1972, which is incorporated herein in its entirety. Yet another type of laser is a KrF excimer laser having a wavelength of about 248 nm, an Eg of 5.0 eV, an efficiency of about 3%, and an output energy of 350 mJ. The laser beam is typically a circular beam having a beam diameter of typically less than about 10 mm, and more typically from about 0.5 mm to about 4 mm. Thus, suitable laser beams can have wavelengths of from about 190 nm to about 10,600 nm. The laser is typically operated at a power level of from about 5 Watts to about 10,000 Watts.

The laser 50 produces a laser beam 56 that is focused at a primary focal point 58 and is re-imaged by a refocusing mirror 62 which provides a larger focal length, to a secondary focal point 84. Between the refocusing mirror 62 and the secondary focal point 84 is the dithering mirror 68 which is connected to a dithering drive motor 72 which vibrates the dithering mirror 68 at a preselected frequency. The dithering drive motor 72 vibrates the dithering mirror 68 about an axis 76 substantially in the plane of the mirror 68 and transverse to the incident laser beam 56 focused by mirror. The dithered beam emanating from the dithering mirror 68 spatially oscillates an arc line which is transverse to the plane of the drawing in FIG. 1.

Typically, the laser beam 56 has an intensity distribution across the beam diameter, also called the intensity profile or intensity shape of the beam, which depends on the type of laser 50. A common beam profile shape is a Gaussian shape, and more typically a U-shaped intensity profile. Focusing of the laser beam changes the cross-sectional size of the beam but not its beam intensity distribution which remains Gaussian or U-shaped. One method of correcting for the Gaussian or U-shaped cross-section of the laser beam is to spatially oscillate the laser beam 56, also known as dithering. The spatial oscillation of the laser beam 56 may be sinusoidal, sawtooth or square waves. Spatial oscillation or dithering of the laser beam 56 produces an average and more uniform intensity of radiation across the region scanned by the dithering beam. In one embodiment, the laser beam 56 has an approximate Gaussian distribution at its focal point and the spatial oscillation or dithering is sinusoidal. The dithering is produced by the dithering mirror 76 which oscillates back and forth on the axis 76 that is parallel to the plane of the mirror 76 and transverse to the plane of the dither. Typically, the dithered beam covers an area that at least twice as large as the undithered beam. For sinusoidal dithering, the average intensity at each point across the dithering beam projected on the localized surface region is approximately flat in the center region and with peaks at the opposite ends. The resulting intensity profile of the dithering beam is shaped like a square wave and provides a good intensity profile for scanning across the localized surface region in contiguous, overlapping sweeps. However, other beam shapes, such as sine wave shapes, can also be used with appropriately compensating laser scanning methods.

The dithered beam then passes through a beam width controlling aperture 80 having a controllable or predefined fixed aperture 82 at the second focal point 84. The aperture 80 is located between the dithering mirror 76 and a second focusing system 90 which may be a scanning mirror or lens. The axis 76 of mirror 68 may be transverse or parallel to the plane of the drawing in FIG. 1. The beam is then projected onto a scanning mirror 92 driven by a scanning system 94. The scanning system 94 oscillates the mirror 92 on its axis 96 to sweep and scan the beam 56 back and forth over a selected localized region 100 on the chamber component being treated. The scanned beam passes through a window 102 in the enclosure 100. The sweep rate of scanning mirror 92 is typically slower than the dither frequency of the dithering mirror 68. For example, a focused $CO_2$ laser having a beam diameter of about 500 μm may be scanned at from about 1 mm/sec to about 100 mm/sec.

The scanning system communicates with an X-Y movable stage 110 which is driven by a stage motor 114. The stage 110 can also be adapted to slide in the Z or vertical direction to change the beam width incident on the component. The scanning system 94 synchronizes the sweep rate of the scanning mirror 92 with the movement of the stage 110, and consequently, the movement of the chamber component resting on the stage 110, to uniformly scan the dithered and apertured beam across the component. The scanning parameters are selected to uniformly heat the localized surface region across which the beam is being scanned, by adjusting the scanning speed and pattern to compensate for the shape of the laser beam. For example, the intensity distribution of the beam 56 can contain rings around a central maximum and even a depression in the middle of the beam due to near field annular characteristics of the beam. Furthermore, it is also desirable to overlap the beam scans to compensate for any variation in the cross-sectional intensity of a laser beam—if the laser beam sweeps across the surface in raster-type scans without overlapping of beam scans, the depth of heat treatment may vary across the beam scan depending on the shape of the beam.

The laser beam annealing apparatus 50 further comprises a controller 118 which controls operation of the system and is connected to the power supply 55, which powers the laser 54, the dithering drive motor 72, and the scanning system 94. In addition, the controller 118 accepts input from a user input device 120 and displays input parameters, and scanning system information on a display 122. The controller 118 can be a conventional computer having a central processing unit (CPU) connected to suitable memory devices, including random access memory and storage memory on disk drives, and interface cards and buses. The laser beam annealing apparatus 50 is capable of laser annealing localized surface regions across the component surface with good uniformity over the entire surface region.

Figure 5:
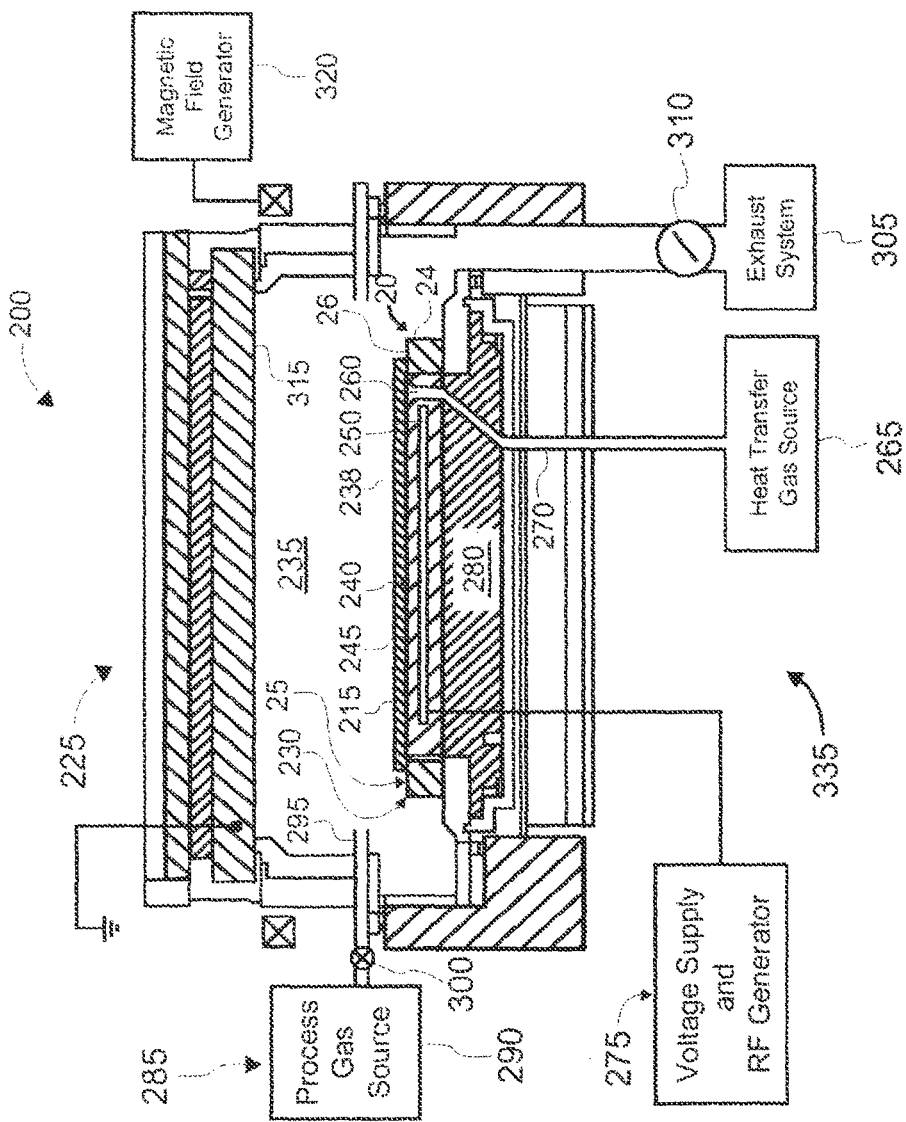
FIG. 5 is a sectional schematic view of a substrate processing chamber that uses the ring of FIG. 2.

A component 20 that is annealed to reduce or heal microcracks can be used in a substrate processing apparatus 200, as schematically illustrated in FIG. 5, which is used to fabricate substrates 215, such as semiconductor wafers and displays. The apparatus 200 can be a MxP, MxP Super E, or eMax type etching chamber, which are from Applied Materials Inc., Santa Clara, Calif., and are generally described in commonly assigned U.S. Pat. Nos. 4,842,683 and 5,215,619 to Cheng et al; and U.S. Pat. No. 4,668,338 to Maydan et al, all of which are incorporated herein by reference in their entireties. An exemplary apparatus 200 may be used in a multi-chamber integrated system for processing semiconductor substrates as described in U.S. Pat. No. 4,951,601 to Maydan et al, which is also incorporated herein by reference in its entirety.

Generally, the apparatus 200 comprises a process chamber 225 and ancillary control, electrical, plumbing and support components. A support assembly 230 comprising a support 238 is provided to receive the substrate 215 in a process zone 235. The support 238 may be an electrostatic chuck 240 comprising a dielectric 45 at least partially covering an electrode 250, and having gas outlets 260 through which a heat transfer gas, such as helium, may be passed from a heat transfer gas source 265 via gas conduits 270, to control the temperature of the substrate 215. Alternatively, the support 238 may be a vacuum or mechanical chuck or any other support as is known in the art. The electrode 250 is electrically charged by an electrode voltage supply 275 to electrostatically hold the substrate 215. A base 280 below the electrostatic chuck 240 may optionally contain a heat exchanger, such as channels through which a heat transfer fluid may be circulated.

Process gas is introduced into the chamber 225 through a gas supply 285 that includes a gas source 290 and one or more gas nozzles 295 terminating in the chamber 225. The gas nozzles 295 may be located around the periphery of the substrate 215 (as shown) or in a showerhead mounted on the ceiling of the chamber (not shown). A gas flow controller 300 is used to control the flow rate of the process gas. Spent process gas and byproducts are exhausted from the chamber 225 through an exhaust system 305. The exhaust system 305 typically comprises an exhaust conduit leading to a plurality of pumps, such as roughing or high vacuum pumps, that evacuate the gas in the chamber 225. A throttle valve 310 is provided in the exhaust conduit to control the pressure of the gas in the chamber 225.

An energized gas, such as for example a gaseous plasma, is generated from the process gas by a gas energizer 275 that couples electromagnetic energy, such as RF or microwave energy, to the process gas in the process zone 235 of the chamber 225. For example, the gas energizer 275 may comprise a first process electrode 315 such as an electrically grounded sidewall or ceiling of the chamber and a second electrode which may be the electrode 250 in dielectric 245. The first and second electrodes 315, 250 are electrically biased relative to one another by an RF voltage provided by an electrode voltage supply 275. The frequency of the RF voltage applied to the electrodes 315, 250 is typically from about 50 KHz to about 60 MHz. In other versions, the gas energizer 275 may also or alternatively include an inductor antenna (not shown) comprising one or more coils to inductively couple RF energy to the chamber 225. The capacitively generated plasma may be enhanced by electron cyclotron resonance in a magnetically enhanced reactor in which a magnetic field generator 320, such as a permanent magnet or electromagnetic coils, provides a magnetic field in the chamber 225 that has a rotating magnetic field having an axis that rotates parallel to the plane of the substrate 215.

The chamber 225 may also comprise one or more process monitoring systems (not shown) to monitor the processes being performed on the substrate 215. A typical process monitoring system comprises an interferometric system that measures an intensity of light reflected from a layer being processed on the substrate 215, or a plasma emission analysis system that measures a change in light emission intensity of a gas species in the chamber 225. The process monitoring system is useful to detect an endpoint of a process being performed on the substrate 215.

The laser annealed component 20 such as the ring 25 is fitted around the substrate support 238 of the support assembly 230 in the chamber 225. The ring 25 may protect the support assembly 230, for example, the dielectric 245 of the electrostatic chuck 240 from erosion by preventing contact of the dielectric 245 with the energized process gas in the chamber 225. Alternatively, the ring 25 may have other uses in the support assembly 230.

Figure 6:
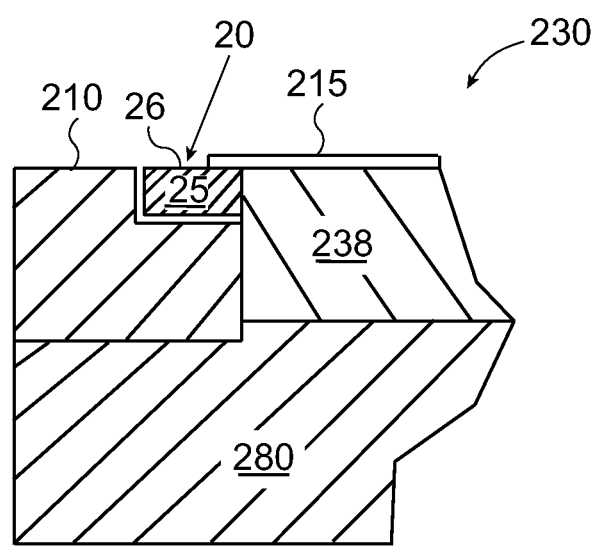
FIG. 6 is a schematic partial sectional side view of support assembly that uses the ring of FIG. 2 in the chamber of FIG. 5.

Referring to FIG. 6, additional structures, such as the collar 210 which surrounds the ring 25 can also be laser annealed to reduce surface microcracks. The collar 210 can be made from a ceramic material such as aluminum oxide or silicon oxide. The collar 210 may serve as a shield, which together with the ring forma replaceable process kit for the chamber. Other annular structures such as chamber wall liners can also be laser annealed, and can also be part of the process kit for the chamber 225.

Although exemplary embodiments of the present invention are shown and described, those of ordinary skill in the art may devise other embodiments which incorporate the present invention, and which are also within the scope of the present invention. For example, the annealed chamber component 20 can be from chamber components such as the ceiling or walls of the chamber 225. In addition, alternative methods of surface annealing can also be used. Furthermore, relative or positional terms shown with respect to the exemplary embodiments are interchangeable. Therefore, the appended claims should not be limited to the descriptions of the preferred versions, materials, or spatial arrangements described herein to illustrate the invention.

What is claimed is:

1. A method of fabricating a processing chamber component, the method comprising:
    (a) forming a processing chamber component having a structural body with surface regions having microcracks; and
    (b) directing a laser beam onto the microcracks of the surface regions of the structural body for a sufficient time to heal and close off the microcracks by themselves and provide a mean Vickers hardness that is at least about 10% higher than the Vickers hardness of the untreated structural body.

2. A method according to claim 1 wherein the surface regions having the microcracks are localized surface regions, and wherein (b) comprises scanning the laser beam across the localized surface regions.

3. A method according to claim 2 wherein the localized surface regions are edges of the structural body.

4. A method according to claim 1 wherein each microcrack has crack surfaces, and wherein (b) comprises directing the laser beam onto the microcracks for a sufficient time to cause the crack surfaces of each microcrack to contact one another.

5. A method according to claim 1 wherein each microcrack has a microcrack plane and crack surfaces, and wherein (b) comprises directing the laser beam onto the microcracks for a sufficient time to cause the crack surfaces of each microcrack to contact one another across the entire microcrack plane.

6. A method according to claim 1 wherein (b) comprises directing the laser beam onto the microcracks for a sufficient time to provide an annealed structural body having a mean fracture stress that is at least about 25% higher than the untreated structural body.

7. A method according to claim 1 comprising generating the laser beam with a $CO_2$ laser.

8. A method according to claim 1 comprising directing a laser beam having a wavelength of from about 190 nm to about 10,600 nm.

9. A method according to claim 1 comprising directing a laser beam having a power level of from about 5 Watts to about 10,000 Watts.

10. A method according to claim 1 wherein (a) comprises forming a structural body comprising at least one of:
    (i) rotational symmetry about an internal axis; and
    (ii) that is a ring, plate or cylinder.

11. A method according to claim 1 wherein (a) comprises forming a structural body composed of a ceramic, glass or glass-ceramic.

12. A method according to claim 1 wherein (a) comprises forming a structural body composed of quartz.

13. A method of fabricating a substrate processing chamber component, the method comprising:
    (a) forming a processing chamber component having a structural body with surface regions having microcracks with crack surfaces; and
    (b) annealing the microcracks to heal and close off the microcracks by themselves such that the crack surfaces of each microcrack are in contact with one another and to provide an annealed structural body having at least one of (i) a mean Vickers hardness that is at least about 10% higher than the Vickers hardness of the untreated structural body, and (ii) a mean fracture stress that is at least about 25% higher than the untreated structural body.

14. A method according to claim 13 wherein the surface regions having the microcracks are localized surface regions, and wherein (b) comprises annealing the localized surface regions.

15. A method according to claim 13 wherein each microcrack has a microcrack plane, and wherein (b) comprises annealing the microcracks for a sufficient time to cause the crack surfaces of each microcrack to contact one another across the entire microcrack plane.

16. A method according to claim 13 wherein (a) comprises forming a structural body comprising at least one of:
    (i) that is composed of a ceramic, glass, glass-ceramic or quartz;
    (ii) that has a rotational symmetry about an internal axis; and
    (iii) that is a ring, plate or cylinder.

17. A method of fabricating a substrate processing chamber component, the method comprising:
    (a) forming a processing chamber component having a structural body with localized surface regions having microcracks with crack surfaces; and
    (b) annealing the microcracks by directing a laser beam on the localized surface regions for a sufficient time to heal and close off the microcracks by themselves such that (i) the crack surfaces of each microcrack are in contact with one another, and (ii) the annealed structural body has a mean Vickers hardness that is at least about 10% higher than the Vickers hardness of the untreated structural body.

18. A method according to claim 17 comprising directing a laser beam on the localized surface regions for a sufficient time to form an annealed structural body having a mean fracture stress that is at least about 25% higher than the untreated structural body.

19. A method according to claim 17 wherein each microcrack has a microcrack plane, and wherein (b) comprises directing the laser beam onto the microcracks for a sufficient time to cause the crack surfaces of each microcrack to contact one another across the entire microcrack plane.

20. A method according to claim 17 wherein (a) comprises forming a structural body comprising at least one of:
   (i) that is composed of a ceramic, glass, glass-ceramic or quartz;
   (ii) that has a rotational symmetry about an internal axis; and
   (iii) that is a ring, plate or cylinder.

* * * * *